(12) United States Patent
Sato et al.

(10) Patent No.: US 12,040,282 B2
(45) Date of Patent: Jul. 16, 2024

(54) ELECTRONIC DEVICE INCLUDING INTERPOSERS BONDED TO EACH OTHER

(71) Applicant: Microchip Technology Incorporated, Chandler, AZ (US)

(72) Inventors: Justin Sato, West Linn, OR (US); Bomy Chen, Newark, CA (US); Anu Ramamurthy, Newbury Park, CA (US); Julius Kovats, Manitou Springs, CO (US)

(73) Assignee: Microchip Technology Incorporated, Chandler, AZ (US)

( * ) Notice: Subject to any disclaimer, the term of this patent is extended or adjusted under 35 U.S.C. 154(b) by 243 days.

(21) Appl. No.: 17/667,275

(22) Filed: Feb. 8, 2022

(65) Prior Publication Data

US 2023/0109629 A1 Apr. 6, 2023

Related U.S. Application Data

(60) Provisional application No. 63/251,412, filed on Oct. 1, 2021.

(51) Int. Cl.
*H01L 23/538* (2006.01)
*H01L 25/00* (2006.01)
(Continued)

(52) U.S. Cl.
CPC ........ *H01L 23/5385* (2013.01); *H01L 25/105* (2013.01); *H01L 25/50* (2013.01);
(Continued)

(58) Field of Classification Search
CPC .... H01L 23/5385; H01L 25/50; H01R 12/737
(Continued)

(56) References Cited

U.S. PATENT DOCUMENTS

2003/0057540 A1 3/2003 Shieh ........................... 257/686
2010/0086164 A1* 4/2010 Gong ....................... H04R 1/04
381/369

(Continued)

OTHER PUBLICATIONS

Vogt, M. et al., "Dielectric barriers for Cu Metallization Systems," Microelectronic Engineering, vol. 37-38, pp. 181-187.
(Continued)

*Primary Examiner* — Andargie M Aychillhum
(74) *Attorney, Agent, or Firm* — SLAYDEN GRUBERT BEARD PLLC

(57) ABSTRACT

An electronic device includes a first interposer, a first integrated circuit (IC) device affixed to the first interposer, a second interposer, and a second IC device affixed to the second interposer. he second interposer is bonded to the first interposer. The first interposer includes first interposer circuitry and a first connection element electrically connected to the first interposer circuitry. The second interposer includes second interposer circuitry and a second connection element electrically connected to the second interposer circuitry. The second connection element is bonded to the first connection element to define a connection element pair. The connection element pair provides an electrical connection between the first interposer circuitry and the second interposer circuitry.

24 Claims, 10 Drawing Sheets

(51) Int. Cl.
  *H01L 25/10*   (2006.01)
  *H01L 23/498*  (2006.01)
  *H01R 12/73*   (2011.01)

(52) U.S. Cl.
  CPC .  *H01L 23/49811* (2013.01); *H01L 2225/1023* (2013.01); *H01L 2225/107* (2013.01); *H01R 12/737* (2013.01)

(58) Field of Classification Search
  USPC .......................................................... 361/783
  See application file for complete search history.

(56) References Cited

U.S. PATENT DOCUMENTS

| | | | |
|---|---|---|---|
| 2014/0001622 A1* | 1/2014 | Bauer | H01L 23/3171 257/734 |
| 2016/0372448 A1 | 12/2016 | Yazdani | 257/686 |
| 2018/0045885 A1 | 2/2018 | Canali et al. | |
| 2019/0148342 A1* | 5/2019 | Hu | H01L 25/105 257/659 |
| 2020/0243450 A1* | 7/2020 | Cho | H01L 23/5385 |
| 2020/0402959 A1* | 12/2020 | Eom | H01L 25/18 |
| 2021/0183842 A1 | 6/2021 | Fay et al. | |
| 2021/0398906 A1* | 12/2021 | Qian | H01L 23/5385 |

OTHER PUBLICATIONS

Minz, Jacob et al., "Thermal and Cross-Talk Aware Physical Design for 3d System-on-Package," 2005 Electronic Components and Technology Conference, pp. 824-831.
Lai, Jian-Lun et al., "Using an SU-8 Photoresist Structure and Cytochrome C Thin Film Sensing Material for a Microbolometer," Sensors, vol. 12, pp. 16390-16403.
Nakamura, Yoshihiro et al., "Technology Trends and Future History of Semiconductor Packaging Substrate Material," Review, Hitachi Chemical Technical Report No. 55, pp. 24-29.
Ohara, Yuki, "A Cost Effective Via Last TSV Technology Using Molten Solder Filling for Automobile Application," 2017 IEEE 67th Electronic Components and Technology Conference (ECTC), pp. 47-52.
Bright Machines, "New Assembly Method for DIMM Insertion," Webinar, URL: https://lpp.brightmachines.com/webinar-new-assembly-method-for-dimm-insertion-recording/, 2 pages.
International Search Report and Written Opinion, Application No. PCT/US2022/022708, 13 pages.

* cited by examiner

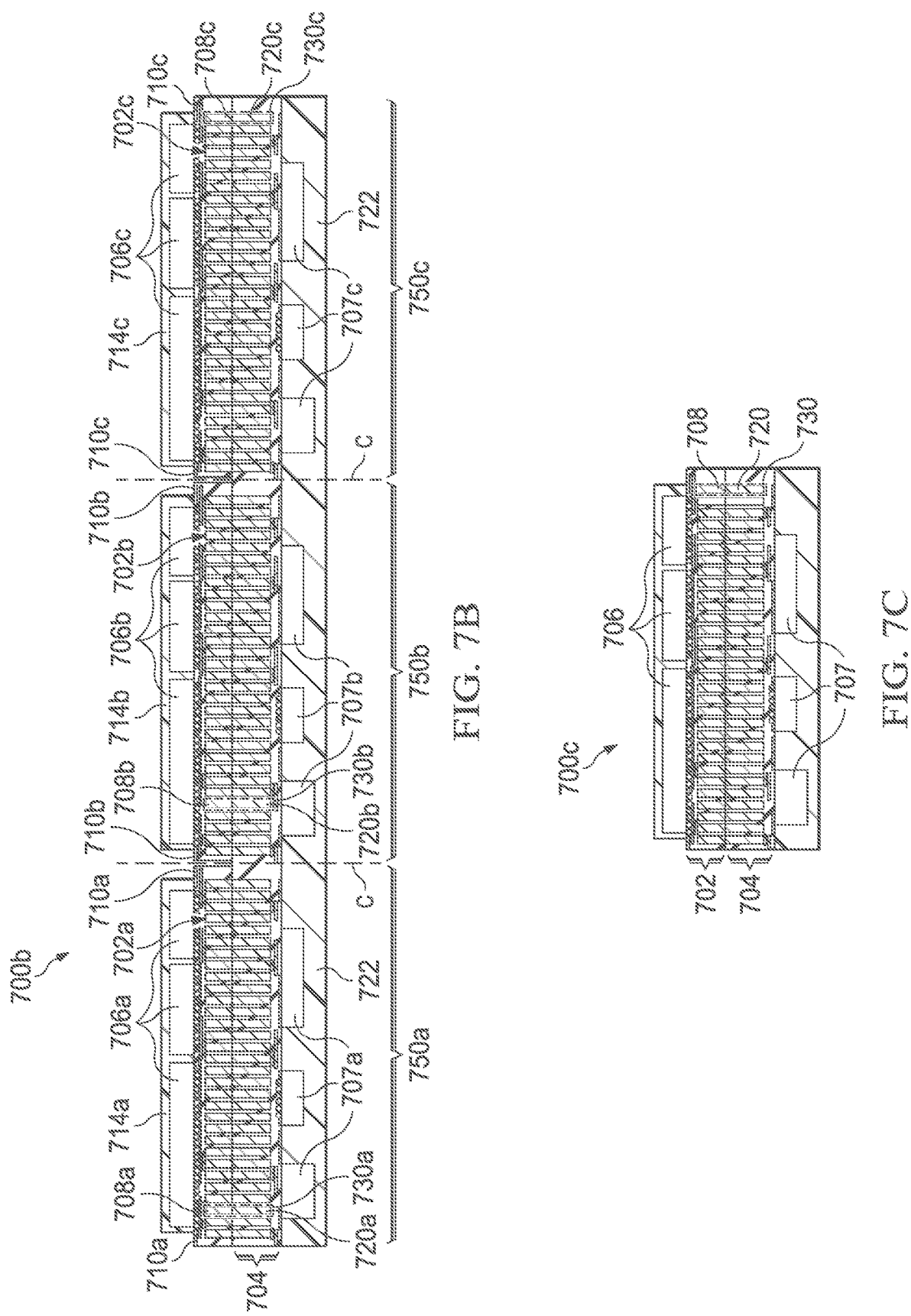

ELECTRONIC DEVICE INCLUDING INTERPOSERS BONDED TO EACH OTHER

RELATED PATENT APPLICATION

This application claims priority to commonly owned U.S. Provisional Patent Application No. 63/251,412 filed Oct. 1, 2021, the entire contents of which are hereby incorporated by reference for all purposes.

TECHNICAL FIELD

The present disclosure relates to electronic devices, and more particularly to an electronic device including multiple interposers bonded to each other.

BACKGROUND

Integrated circuit (IC) devices, e.g., dies (chips), interposers, and other types of devices, are often mounted directly to a printed circuit board (PCB). This often creates a mismatch in the respective coefficients of thermal expansion (CTEs) of the structures mounted to each other, for example a CTE mismatch between a PCB and an IC device mounted thereon. When the PCB and mounted IC device experience temperature changes, for example during a reflow heating process or reflow cooling process, the CTE mismatch between the PCB and mounted IC device may cause warping, breakage, or other damage to the PCB, the mounted IC device, or a solder connection between the PCB and mounted IC device.

Thus, an IC package substrate or "sub-substrate" including balanced CTE materials or multiple layers with specific CTE characteristics may be arranged between an IC device and PCB to reduce the CTE mismatch between the IC device and PCB. However, these sub-substrates are typically complex and expensive.

In addition, for IC dies mounted directly on a PCB, electrical connections between multiple IC dies run laterally across the PCB, with a relatively low connection density due to geometrical limitations of the IC devices (e.g., pin-out limitations) and PCB circuitry. Data communications between IC dies mounted on a PCB may thus be limited (e.g., in terms of throughput or delays) by such constraints on the physical connections between the IC dies.

There is a need for a reliable and cost-effective manner for mounting IC devices to PCBs or other device mounting substrates, with a low CTE mismatch between the relevant structures. There is also a need for mounting IC devices (e.g., dies) in a manner that increases data connection throughput and/or reduces delay between multiple IC devices.

SUMMARY

The present disclosure provides electronic devices, for examples an electronic device including a stacked IC device assembly including two or more interposers bonded to each other (or optionally to opposing sides of an intermediate substrate, e.g., glass substrate). Each interposer may carry one or more IC devices (e.g., IC dies) mounted thereon. The stacked IC device assembly may be mounted on a chip carrier (e.g., a leadframe or copper clip) to define an IC package. The IC package may be mounted on a package mounting substrate (e.g., a PCB). The chip carrier, which lifts the stacked IC device assembly off the package mounting substrate, may be structurally flexible to thereby absorb CTE-related expansion and/or contraction of the mounted stacked IC device assembly, and thereby decouple a CTE mismatch between the stacked IC device assembly and the underlying package mounting substrate. Some examples may thus eliminate the "sub-substrate" used in certain conventional packages for reducing CTE related issues, which may reduce cost and/or complexity as compared with such conventional packages.

In addition, IC devices (e.g., dies) mounted on opposing interposers bonded to each other in a stacked IC device assembly may be communicatively connected to each other by an array of electrical connections extending through the bonded interposers (e.g., including "connection element pairs" defined in a pair of bonded interposers, as discussed below). These electrical connections between IC devices mounted on opposing interposers may have a significantly shorter distance than connections between IC devices mounted directly on a PCB in a conventional arrangement, resulting in lower communication delays or latency. In addition, the electrical connections between IC devices mounted on opposing interposers may have a significantly greater density of electrical connections than connections between IC devices mounted directly on a PCB in a conventional arrangement. For example, an array of electrical connections extending vertically through the bonded interposers of a stacked IC device assembly may have a density of at least 500 electrical connections per $mm^2$ in a horizonal plane, or in some examples a density of at least 1,000 electrical connections per $mm^2$ in a horizonal plane, or in some examples a density of at least 1,000,000 electrical connections per $mm^2$ in a horizontal plane.

One aspect provides an electronic device including a first interposer, a first IC device affixed to the first interposer, a second interposer, and a second IC device affixed to the second interposer, wherein the second interposer is bonded to the first interposer. The first interposer includes first interposer circuitry and a first connection element electrically connected to the first interposer circuitry. The second interposer includes second interposer circuitry and a second connection element electrically connected to the second interposer circuitry. The second connection element is bonded to the first connection element to define a connection element pair providing an electrical connection between the first interposer circuitry and the second interposer circuitry.

In some examples, the first IC device includes first IC device circuitry, the second IC device includes second IC device circuitry, and the first IC device circuitry is electrically connected to the second IC device circuitry via the first interposer circuitry, the connection element pair, and the second interposer circuitry.

In some examples, the first interposer, the second interposer, the first IC device, and the second IC device are part of an IC package, and the IC package is mounted to a package mounting substrate including package mounting substrate circuitry. In some examples, the package mounting substrate comprises a printed circuit board (PCB).

In some examples, the IC package includes a chip carrier. The first interposer, the second interposer, the first IC device and the second IC device are part of a stacked IC device assembly, which stacked IC device assembly forms part of the IC package. The stacked IC device assembly is affixed to the chip carrier, and the chip carrier is mounted to the package mounting substrate. In some examples, the chip carrier comprises a copper clip or a lead frame.

In some examples, the first interposer circuitry includes an IC package contact, the second interposer circuitry is electrically connected to the IC package contact via the connection element pair, and the IC package includes a first wire bond connection between the IC package contact and the chip carrier.

In some examples, at least one of the first connection element and the second connection element comprises a multi-component bonding element including (a) a conduction component formed from a first metal and (b) a bonding component formed from a second metal different than the first metal.

In some examples, the first metal has a first melting point, and the second metal has a second melting point, the second melting point lower than the first melting point. In some examples, the first metal comprises copper, silver, or gold, and the second metal comprises tin, indium, a tin alloy, or an indium alloy.

In some examples, the first connection element comprises a first multi-component bonding element including (a) a first conduction component formed from a first metal and (b) a first bonding component formed from a second metal different than the first metal, and the second connection element comprises a second multi-component bonding element including (a) a second conduction component formed from a third metal and (b) a second first bonding component formed from a fourth metal different than the third metal. In some examples, the first metal and the third metal comprise the same metal, and the second metal and the fourth metal comprise the same metal. In other embodiments, the first metal and the third metal comprise different metals, and/or the second metal and the fourth metal comprise different metals.

In some examples, the electronic device includes a PCB oriented in a first plane and including a PCB slot and PCB circuitry electrically connected to the PCB slot, wherein the IC package is mounted in the PCB slot in an orientation orthogonal to the first plane.

In some examples, the first interposer includes a first contact electrically connected to a first IC device circuitry of the first IC device, the second interposer includes a second contact electrically connected to a second IC device circuitry of the second IC device, the PCB slot includes a first PCB slot contact and a second PCB slot contact, the first contact of the first interposer is electrically connected to the first PCB slot contact, and the second contact of the second interposer is electrically connected to the second PCB slot contact.

In some examples, the first contact of the first interposer comprises a first wire-bond pad or a first pin-out contact on the first interposer, and the second contact of the second interposer comprises a second wire-bond pad or a second pin-out contact on the second interposer.

Another aspect provides an electronic device including an IC package mounted to a package mounting substrate (e.g., a PCB) including package mounting substrate circuitry. The IC package includes a chip carrier, a first interposer assembly, and second interposer assembly. The first interposer assembly includes a first interposer and a first IC device affixed to the first interposer. The second interposer assembly includes a second interposer and a second IC device affixed to the second interposer. The first interposer is bonded to the second interposer with the first interposer and the second interposer arranged between the first IC device and the second IC device. The second interposer assembly is affixed to the chip carrier. The chip carrier is affixed to the package mounting substrate to mount the IC package on the package mounting substrate.

In some examples, the package mounting substrate comprises a PCB.

In some examples, the chip carrier includes a mounting portion physically spaced apart from the package mounting substrate, and the second IC package module is affixed to the mounting portion of the chip carrier.

In some examples, the chip carrier comprises a copper clip or a lead frame.

In some examples, the first interposer includes an IC package contact, and the IC package includes a wire bond connection between the IC package contact and the chip carrier.

In some examples, the first interposer includes a first connection element, the second interposer includes a second connection element bonded to the first connection element, and at least one of the first connection element and the second connection element comprises a multi-component bonding element including (a) a conduction component formed from a first metal and (b) a bonding component formed from a second metal different than the first metal.

Another aspect provides an electronic device including a first interposer, a first IC device affixed to the first interposer, a second IC device affixed to a second interposer, and an intermediate substrate arranged between the first interposer and the second interposer. The first interposer includes first interposer circuitry and a first connection element electrically connected to the first interposer circuitry. The second interposer includes second interposer circuitry and a second connection element electrically connected to the second interposer circuitry. The intermediate substrate arranged between the first interposer and the second interposer includes an intermediate connection element extending through a thickness of the intermediate substrate. The first connection element of the first interposer is bonded to a first side of the intermediate connection element. The second connection element of the second interposer is bonded to a second side of the intermediate connection element. The first connection element, the intermediate connection element, and the second connection element provide an electrical connection between the first interposer circuitry and the second interposer circuitry.

In some examples, the intermediate substrate comprises a glass substrate.

In some examples, the intermediate connection element comprises a multi-component bonding element including (a) a conduction component formed from a first metal and (b) a bonding component formed from a second metal different than the first metal.

In some examples, the first connection element comprises a first multi-component bonding element including (b) a first conduction component formed from a first metal and (b) a first bonding component formed from a second metal different than the first metal, wherein the first bonding component is bonded to the first side of the intermediate connection element, and the second connection element comprises a second multi-component bonding element including (a) a second conduction component formed from a third metal and (b) a second bonding component formed from a fourth metal different than the third metal, wherein the second bonding component is bonded to the second side of the intermediate connection element.

BRIEF DESCRIPTION OF THE DRAWINGS

Example aspects of the present disclosure are described below in conjunction with the figures, in which:

FIGS. 7A, 7B, and 7C are cross-sectional side views of example IC device assemblies with interposer assemblies mounted to each other.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
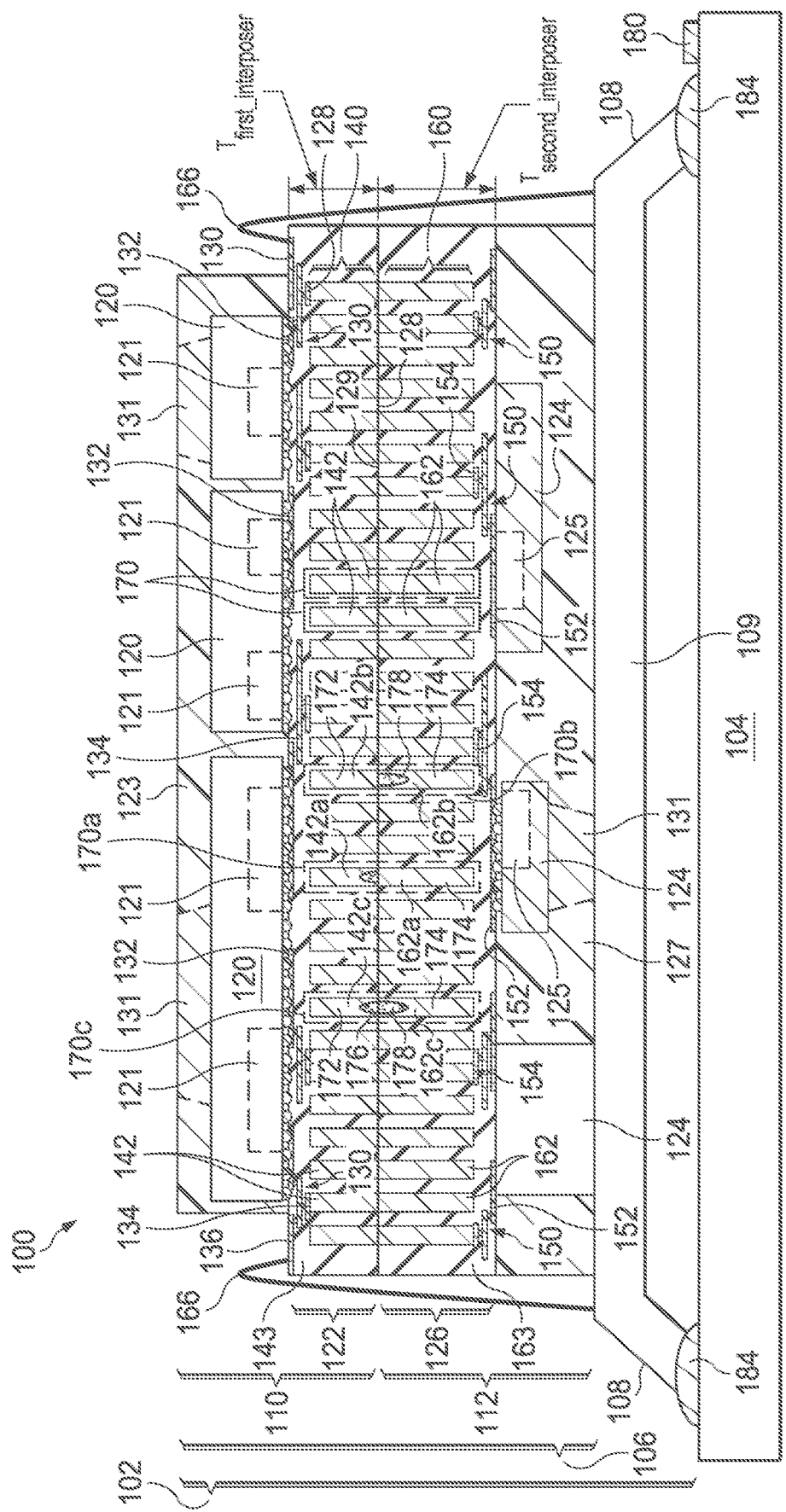
FIG. 1 is a cross-sectional side view of example electronic device including an example IC package, including first and second interposers bonded to each other, mounted to a package mounting substrate.

FIG. 1 is a cross-sectional side view of example electronic device 100 including an IC package 102 mounted to a package mounting substrate 104. In this example the IC package 102 is embodied as a system in package (SiP) including a stacked IC device assembly 106 mounted on a chip carrier 108. The stacked IC device assembly 106 includes a first interposer assembly 110 (also referred to as upper interposer assembly 110) bonded to a second interposer assembly 112 (also referred to as lower interposer assembly 112). The first interposer assembly 110 includes at least one first IC device 120 mounted to a first interposer 122, and the second interposer assembly 112 includes at least one second IC device 124 mounted to a second interposer 126, which second interposer 126 is bonded to the first interposer 122. In particular, a front side surface 128 of the first interposer 122 is physically bonded to a front side surface 129 of the second interposer 126, as discussed below in more detail. In some examples, a thickness $T_{first\_interposer}$ of the first interposer 122 and a thickness $T_{second\_interposer}$ of the second interposer 126 may each be in the range of 25-100 µm.

Each first IC device 120 and second IC device 124 may include any type of IC device suitable for mounting to an interposer, for example IC dies (e.g., processors, memory devices, input/output devices, and/or other types of IC dies), heat transfer elements, and/or other electronics.

Figure 4A:
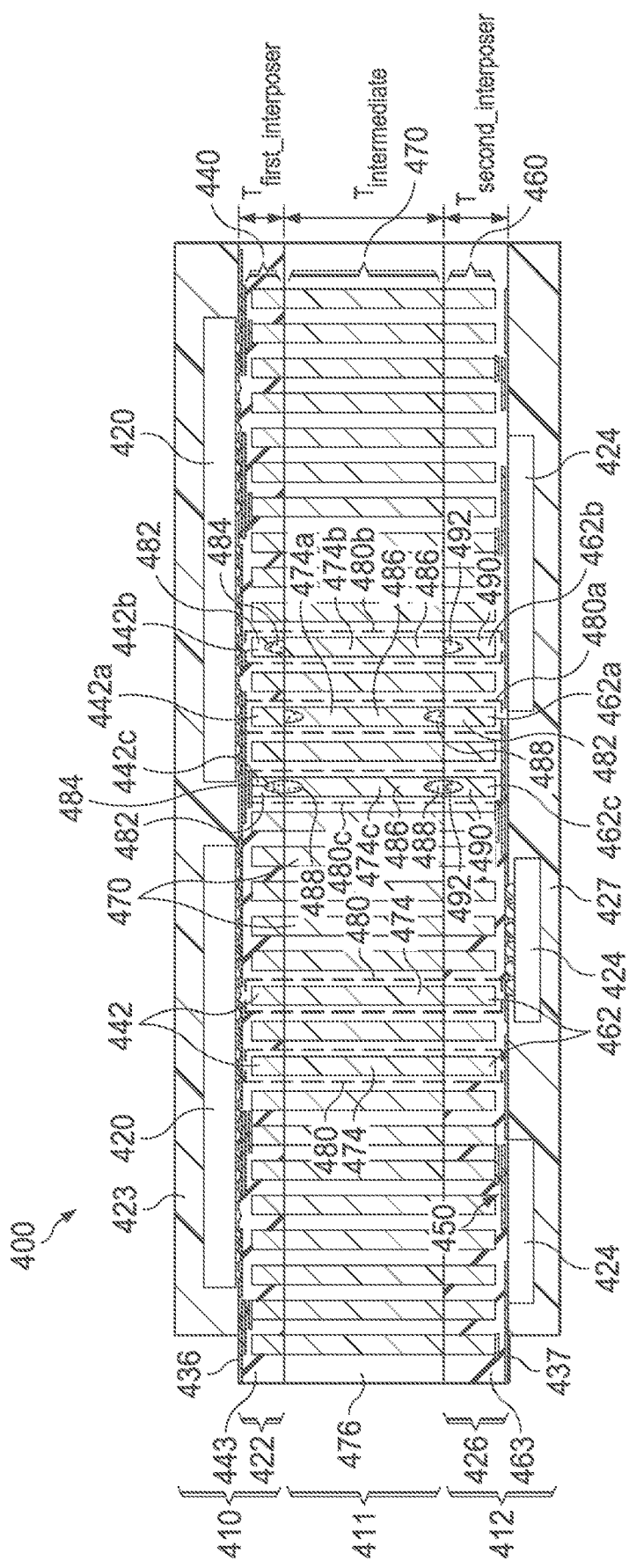
FIGS. 4A and 4B are a cross-sectional side view (FIG. 4A) and a three-dimensional view (FIG. 4B) of an example stacked IC device assembly including first and second interposers bonded to opposing sides of an intermediate substrate (e.g., glass substrate)
Figure 4B:
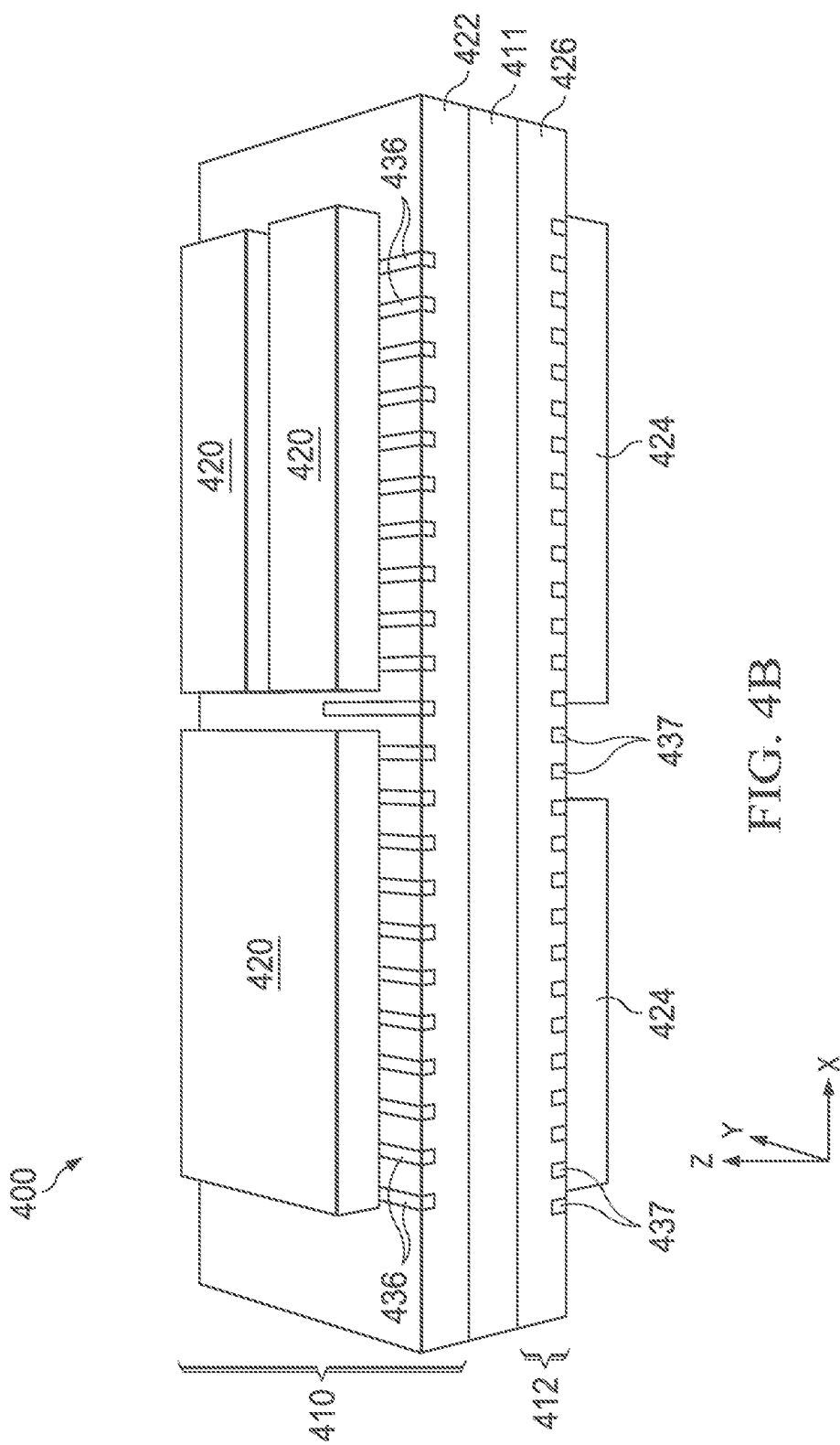

First IC device(s) 120 may be mounted to first interposer 122 in any suitable manner, e.g., using ball-grid array (BGA) solder bonds or other connections. First IC device(s) 120 may be encapsulated by an encapsulation material 123, e.g., an epoxy mold compound. Similarly, second IC device(s) 124 may be mounted to second interposer 126 in any suitable manner, e.g., using BGA solder bonds or other connections. Some or all second IC device(s) 124 may be encapsulated by an encapsulation material 127, e.g., an epoxy mold compound. In some examples, encapsulation material 127 may provide a flat and reinforced surface to physically support and facilitate a pressure-based bonding of first interposer 122 and second interposer 126 to each other (or to an intermediate glass substrate, as shown in FIGS. 4A-4B).

As shown in FIG. 1, in some examples a heat transfer device 126 may be attached to at least one first IC device 120 and/or second IC device 124 to facilitate heat transfer away from the respective first IC device 120 or second IC device 124. For example, each heat transfer device 126 may include a passive heat sink.

Each first IC device 120 mounted on first interposer 122 may include first IC device circuitry 121, and each second IC device 124 mounted on second interposer 126 may include second IC device circuitry 125. However, some first IC devices 120 and/or second IC devices 124, e.g., passive heat sinks, may not include circuitry. In some examples, first IC device(s) 120 mounted on first interposer 122 may include high performance dies, whereas second IC device(s) 124 mounted on second interposer 126 may include support devices providing functional or operational support for high performance first IC device(s) 120 mounted on first interposer 122. For example, first IC devices 120 may include one or more FPGA die, SERDES die, and/or HBM/DRAM die, and second IC devices 124 may include one or more low-dropout (LDO) voltage regulator, power management integrated circuit (PMIC) die, and/or passive heat sink.

The first interposer 122 includes first interposer circuitry 130 including front side contacts 132, back side contacts 134, IC package contacts 136, and/or other circuitry connecting any one or more front side contacts 132, back side contacts 134, and/or IC package contacts 136 to each other. In some examples, first interposer circuitry 130 comprises metal interconnect circuitry (e.g., high-speed redistribution layer (RDL) wiring), and front side contacts 132 and back side contacts 134 comprise elements formed in the metal interconnect circuitry. IC package contacts 136 may comprise wire bond pads, pin-out contacts, or other contacts suitable for receiving a wire bond connection.

In some examples, the encapsulation material 123 encapsulating the first IC device(s) 120 may cover all first interposer circuitry 130, including front side contacts 132, except for IC package contacts 136 located at the perimeter of the first interposer 122. In some examples, encapsulation material 123 may be formed on a full lateral width of the first interposer 122 (e.g., in the x-direction and/or y-direction) and then selectively etched or removed to uncover the IC package contacts 136 at the perimeter of the first interposer 122.

The first interposer 122 also includes a first connection element array 140 of first connection elements 142, including example first connection elements 142a, 142b, and 142c, formed in a passivation region 143, e.g., comprising SiON or other silicon-based passivation region. In some examples, first connection elements 142 (including the example first connection elements 142a, 142b, and 142c discussed below) are formed as through-silicon vias (TSVs). First connection element 142 are electrically connected to selected back side contacts 134. Each first IC device 120 may be connected to selected front side contacts 132 to provide electrical connections between first IC device circuitry 121 and selected first interposer circuitry 130.

The second interposer 126 includes second interposer circuitry 150 including front side contacts 152 and back side contacts 154 connected to selected front side contacts 152. In some examples, second interposer circuitry 150 comprises metal interconnect circuitry, and front side contacts 152 and back side contacts 154 comprise elements formed in the metal interconnect circuitry.

The second interposer 126 also includes a second connection element array 160 of second connection elements 162, including example second connection elements 162a, 162b, and 162c, formed in a passivation region 163, e.g., comprising SiON or other silicon-based passivation region. In some examples, first interposer 122 and second interposer 126 are formed from the same material or materials, to provide the same or similar CTE characteristics between the first interposer 122 and second interposer 126. In some examples, second connection elements 162 (including the example second connection elements 162a, 162b, and 162c discussed below) are formed as through-silicon vias (TSVs). Second connection elements 162 are electrically connected to selected back side contacts 154. Each second IC device 124 may be connected to selected front side contacts 152 to provide electrical connections between the second IC device circuitry 125 of the respective second IC device 124 and selected second connection element(s) 162 via selected second interposer circuitry 150.

First connection elements 142 provided in first interposer 122 are physically bonded and electrically connected to respective second connection elements 162 provided in second interposer 126, to define an array of connection element pairs 170, including example connection element pairs 170a, 170b, and 170b.

In addition, at least some first connection elements 142 and/or second connection elements 162 may be formed as multi-component bonding elements, each including a conduction component 172, 174 formed from a first metal (e.g., copper, silver, or gold) and a bonding component 176, 178 formed from a different second metal (e.g., tin, indium, a tin alloy, or an indium alloy). For example, at least some first connection elements 142 may include a conduction component 172 and a bonding component 176. In addition, or alternatively, at least some second connection elements 162 may include a conduction component 174 and a bonding component 178.

Example connection element pairs 170a, 170b, and 170b illustrate three example structures for each connection element pair 170. Example connection element pair 170a includes (a) a first connection element 142a formed as a multi-component bonding element including a conduction component 172 and a bonding component 176 and (b) a second connection element 162a including at least a conduction component 174, wherein the bonding component 176 forms a physical bond (e.g., solder-type eutectic bond) with the conduction component 174.

Example connection element pair 170b includes (a) a first connection element 142b including at least a conduction component 172 and (b) a second connection element 162b formed as a multi-component bonding element including a conduction component 174 and a bonding component 178, wherein the bonding component 178 forms a physical bond (e.g., solder-type eutectic bond) with the conduction component 172.

Example connection element pair 170c includes (a) a first connection element 142c formed as a multi-component bonding element including a conduction component 172 and a bonding component 176 and (b) a second connection element 162c formed as a multi-component bonding element including a conduction component 174 and a bonding component 178, wherein the bonding components 176 and 178 form a physical bond (e.g., solder-type eutectic bond) with each other (and/or with adjacent surface(s) of conduction component 172 and/or conduction component 174). Conduction component 174 and conduction component 172 form an electrical connection of lower resistivity than the physical bond.

As noted above, selected front side contacts 132 may be electrically connected to respective first IC device circuitry 121 of each first IC device 120 mounted on first interposer 122. Further, each front side contact 132 may be:
(a) electrically connected to at least one IC package contact 136 (via selected elements of first interposer circuitry 121) to provide electrical connection between selected first IC device circuitry 121 of each first IC device 120 and selected circuitry 180 provided on package mounting substrate 104 (e.g., PCB) via selected wire bonds 166, chip carrier 108, and solder bump connections 184 or other bonding material or method, and/or
(b) electrically connected to at least one back side contact 134 to provide electrical connection between selected first IC device circuitry 121 of at least one first IC device 120 and selected second IC device circuitry 125 of at least one second IC device 124 via selected connection element pairs 170 and second interposer circuitry 150.

Thus, first interposer circuitry 130 (e.g., comprising RDL metal) may provide electrical connections:
(a) between selected upper IC device(s) 120 and selected IC package contact(s) 136, and/or
(b) between selected first connection elements 142 and selected IC package contact(s) 136, e.g., to connect selected second IC device(s) 124 to selected IC package contact(s) 136 (via selected connections element pairs 170 and selected first interposer circuitry 130), and/or
(c) between selected first connection elements 142 and selected first IC device(s) 120, e.g., to connect selected first IC device(s) 120 to selected second IC devices 124 (via selected connection element pairs 170).

Thus, in some examples, first interposer circuitry 130 (e.g., comprising RDL metal), connection element pairs 170, and second interposer circuitry 150 collectively define a number of electrical connections for communicating data between selected first IC device(s) 120 and selected second IC devices 124. In some examples, these electrical connections have very short distances (e.g., less than 1 mm), especially as compared with electrical connections between multiple IC devices mounted directed on a PCB in a conventional arrangement. In addition, the electrical connections between first IC device(s) 120 and second IC devices 124 may have a significantly greater density, allowing increased data communications, as compared with conventional arrangements. For example, an array of connection element pairs 170 formed in the stacked IC device assembly 106 may have a density of at least 500 connection element pairs 170 per $mm^2$ in a horizonal plane parallel with surfaces 128 and 129, or in some examples a density of at least 1,000 connection element pairs 170 per mm² in the horizontal plane, or in some examples a density of at least 1,000,000 connection element pairs 170 per mm² in the horizontal plane.

Chip carrier 108 may comprise a copper leadframe, a copper clip, or other suitable structure for supporting the stacked IC device assembly 106. As shown, chip carrier 108 may be mounted to the package mounting substrate 104 (e.g., PCB) by solder bump connections 184 or other bonding material or method. Chip carrier 108 may include a mounting portion 109 that is physically spaced apart from (e.g., lifted above) the package mounting substrate 104. The stacked IC device assembly 106 may be affixed to the mounting portion 109. For example, a lower side of the second interposer assembly 112 may be secured to mounting portion 109 by an adhesive or other bonding material. Thus, the stacked IC device assembly 106 may be physically spaced apart from (e.g., lifted above) the package mounting substrate 104. The chip carrier 108 (e.g., leadframe or copper clip) may be structurally flexible to thereby absorb CTE-related expansion and/or contraction of the mounted stacked IC device assembly 106, and thereby decouple a CTE mismatch between the stacked IC device assembly 106 and the underlying package mounting substrate 104.

Figure 2A:
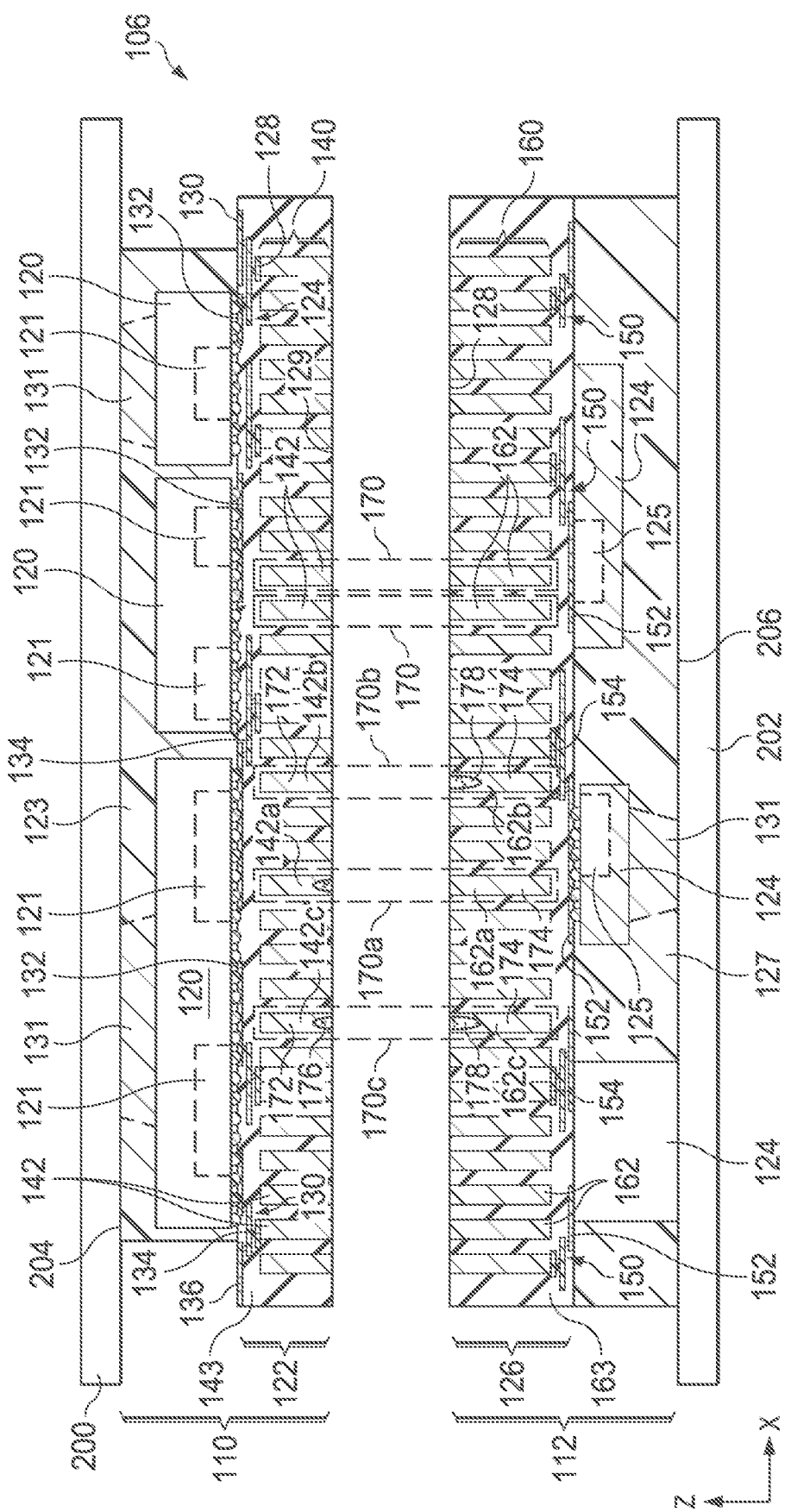
FIGS. 2A and 2B are cross-sectional side views of the example stacked IC device assembly shown in FIG. 1, before bonding the first interposer to the second interposer (FIG. 2A) and after bonding the first interposer to the second interposer (FIG. 2B), according to one example.
Figure 2B:
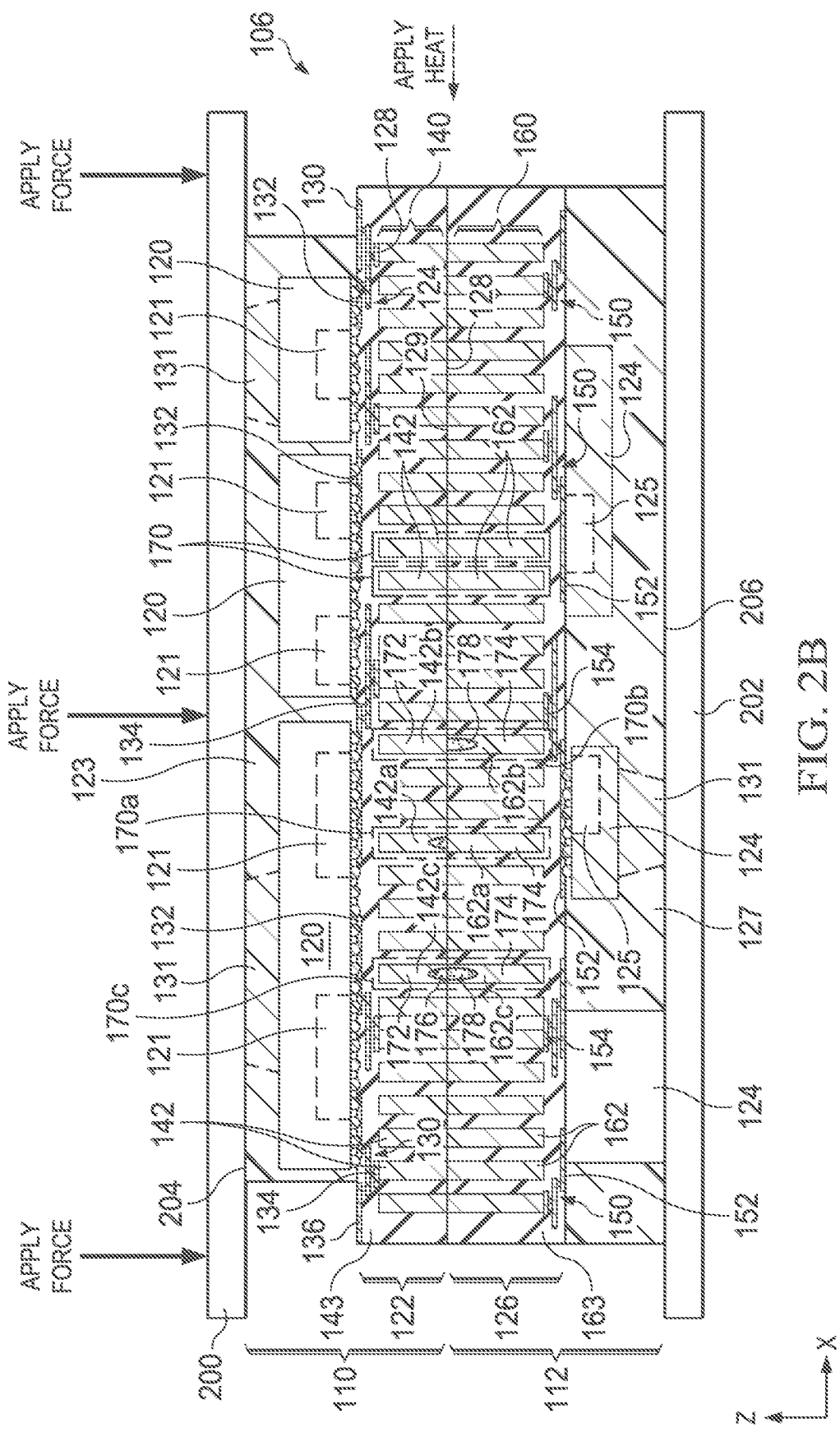

FIGS. 2A and 2B are cross-sectional side view of the example stacked IC device assembly 106 shown in FIG. 1, before bonding the first interposer assembly 110 to the second interposer assembly 112 (FIG. 2A) and after bonding the first interposer assembly 110 to the second interposer assembly 112 (FIG. 2B), according to one example.

As shown in FIG. 2A, the first interposer assembly 112 may be mounted on a first bonding support structure 200, and the second interposer assembly 112 may be mounted on a second bonding support structure 202. In some examples, the encapsulation material 123 (e.g., epoxy mold compound) formed over first IC devices 120 may be formed with a planar outer surface 204 providing a solid engagement between the first interposer assembly 110 and the first bonding support structure 200, and the encapsulation material 127 (e.g., epoxy mold compound) formed over some or all second IC devices 124 may be formed with a planar outer surface 206 providing a physically stable engagement between the second interposer assembly 112 and second bonding support structure 202.

The first interposer assembly 110 may then be aligned relative to the second interposer assembly 112, e.g., in the x-direction and y-direction, to align the first connection elements 142 in first interposer 122 with corresponding second connection elements 162 in second interposer 126.

As shown in FIG. 2B, the front side surface 128 of first interposer 122 and the front side surface 129 of second interposer 126 are bonded to each other by pressing the first interposer assembly 110 and the second interposer assembly 112 together while heating the assembly to a temperature in the range of 180-300° C., for example in the range of 200-250° C. The bonding process may form physical bonds and electrical connections between the first connection element 142 and second connection element 162 in each connection element pair 170.

The physical bond between the first connection element 142 and second connection element 162 in each connection element pair 170 may include multiple aspects, for example any one or more of the following: (a) eutectic or solder-type bonds between opposing bonding components 176 and 178, or between a bonding component 176 or 178 and an opposing conduction component 174 or 172, respectively, or between bonding component 176 and/or 178 and opposing passivation region 163 and/or 143, respectively; (b) covalent or other bonding between opposing conduction components 172 and 174, or between conduction component 172 and/or 174 and opposing passivation region 163 and/or 143, respectively; and/or (c) covalent or other bonding between the opposing passivation region 143 and 163.

Figure 3:
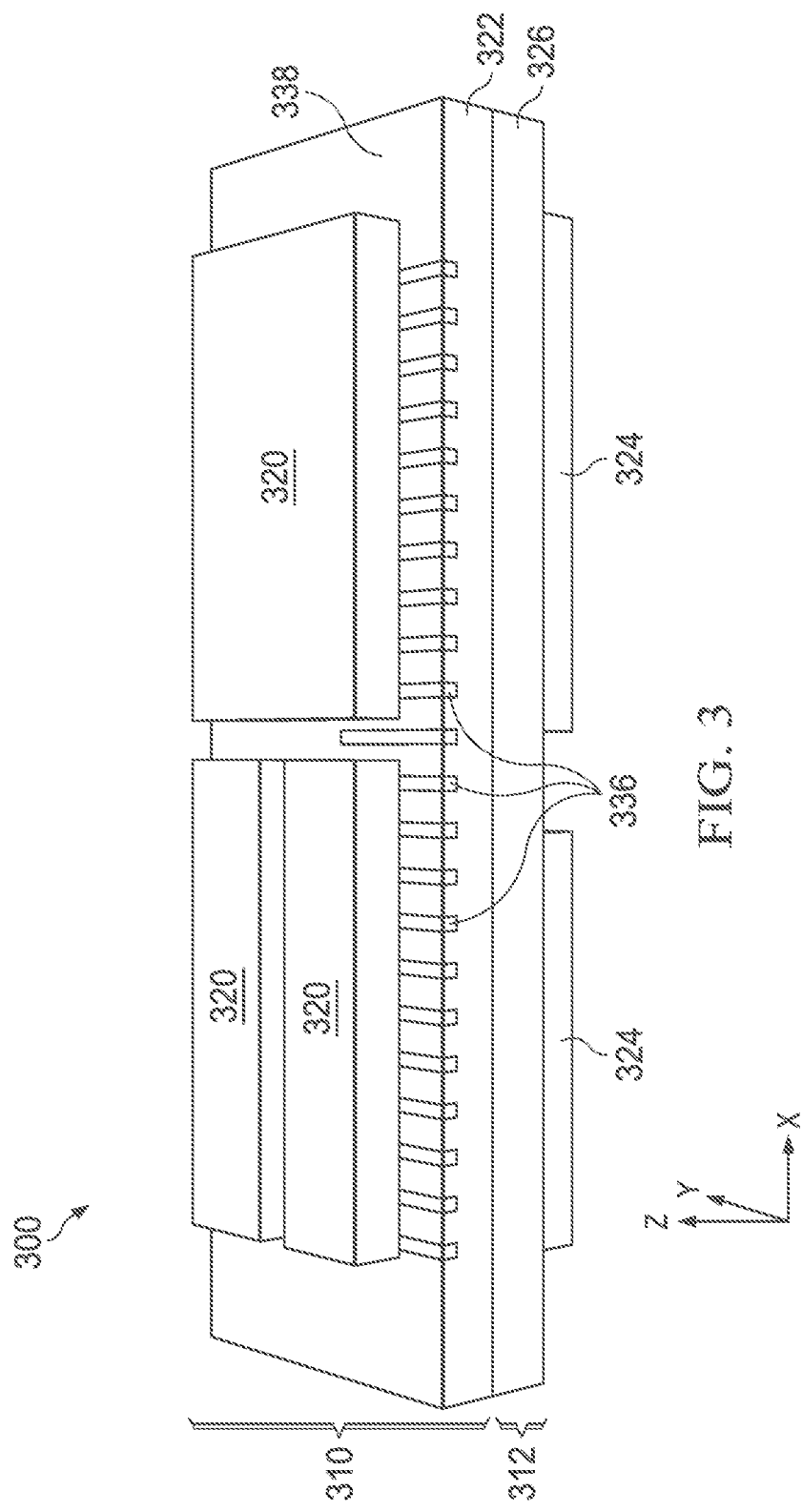
FIG. 3 is a three-dimensional view of an example stacked IC device assembly including first and second interposers bonded to each other.

FIG. 3 is a three-dimensional view of an example stacked IC device assembly 300, e.g., similar to the example stacked IC device assembly 106 shown in FIGS. 1 and 2B, with encapsulation materials 123, 127 not shown, for better understanding. Stacked IC device assembly 300 includes a first interposer assembly 310 mounted to a second interposer assembly 312. First interposer assembly 310 includes first IC devices 320 mounted to a first interposer 322. Second interposer assembly 312 includes second IC devices 324 mounted to a second interposer 326. The first IC devices 320 and second IC devices 324 may be encapsulated by a mold compound or other encapsulation material (not shown). As shown, IC package contacts 336 may be exposed at a top surface 338 of the first interposer 322, which are electrically connected to selected circuitry of first IC devices 320, either directly or via circuitry (e.g., RDL metal) within first interposer 122, e.g., as discussed above with respect to first interposer circuitry 130.

FIGS. 4A and 4B show a side cross-sectional view (FIG. 4A) and a three-dimensional view (FIG. 4B) of an example stacked IC device assembly 400. As shown, stacked IC device assembly 400 includes a first interposer assembly 410 and a second interposer assembly 412 bonded to opposing side surfaces of an intermediate substrate 411, such that the intermediate substrate 411 is arranged between the first interposer assembly 410 and second interposer assembly 412. Intermediate substrate 411 may increase the structural strength and/or stability of the stacked IC device assembly 400.

First interposer assembly 410 includes first IC devices 420 mounted to a first interposer 422 and encapsulated by an encapsulation material 423 (e.g., mold compound). Second interposer assembly 412 includes second IC devices 424 mounted to a second interposer 426 and encapsulated by an encapsulation material 427 (e.g., mold compound). First interposer 422 includes first interposer circuitry 430, and a first connection element array 440 of first connection elements 442, including example first connection elements 442a, 442b, and 442c, formed in a passivation region 443, e.g., comprising SiON or other silicon-based passivation region. Second interposer 426 includes second interposer circuitry 450, and a second connection element array 460 of second connection elements 462, including example second connection elements 462a, 462b, and 462c, formed in a passivation region 463, e.g., comprising SiON or other silicon-based passivation region. First interposer circuitry 430 includes IC package contacts 436, and second interposer circuitry 450 includes IC package contacts 437.

Intermediate substrate 411 may include an intermediate connection element array 470 of intermediate connection elements 474, including example intermediate connection elements 474a, 474b, and 474c, formed in a substrate material 476, e.g., comprising glass. Intermediate substrate 411 (e.g., comprising a glass substrate material 476) may provide thermal isolation between the first interposer 422 and the second interposer 426. In some examples, a thickness $T_{first\_interposer}$ of the first interposer 422 and a thickness $T_{second\_interposer}$ of the second interposer 426 may each be in the range of 25-100 μm, and a thickness $T_{intermediate}$ of the intermediate substrate 411 may be in the range of 200-500 μm.

As shown in FIG. 4A, the first connection element array 440 provided in first interposer 422 is bonded at a first side surface of the intermediate connection element array 470, and the second connection element array 460 provided in second interposer 426 is bonded at a second side surface of the intermediate connection element array 470, to define an array of electrical connections 480 connecting first connection element array 440 with second connection element array 460. Each electrical connection 480 may include a first connection element 442 bonded at a first side of a respective intermediate connection element 474, and a second connection element 462 bonded at a second side of the respective intermediate connection element 474.

First connection elements 442 and second connection elements 462 may be bonded to intermediate connection elements 474 in any suitable manner. For example, first connection elements 442, second connection elements 462, and/or intermediate connection elements 474 may be formed as multi-component bonding elements including a conduction component 482, 490, or 486 and a bonding element 484, 492, or 488. Electrical connections 480a, 480b, and 480c represent three example configurations for each electrical connection 480 in the intermediate connection element array 470.

Example electrical connection 480a includes (a) a first connection element 442a including a conduction component 482, (b) an intermediate connection element 474a including a conduction component 486 and a bonding component 488 formed on both opposing ends of the conduction component 486, and (c) a second connection element 462a including a conduction component 482.

Example electrical connection 480b includes (a) a first connection element 442b including a conduction component 482 and a bonding component 484, (b) an intermediate connection element 474b including a conduction component 486, and (c) a second connection element 462b including a conduction component 490 and a bonding component 492.

Example electrical connection 480c includes (a) a first connection element 442c including a conduction component 482 and a bonding component 484, (b) an intermediate connection element 474c including a conduction component 486 and a bonding component 488 formed on both opposing ends of the conduction component 486, and (c) a second connection element 462c including a conduction component 490 and a bonding component 492.

Conduction components 482, 486, and/or 490 may be similar to conduction components 172 and 174 discussed above, and bonding components 484, 488, and/or 492 may be similar to bonding components 176 and 178 discussed above. For example, conduction components 482, 486, and 490 may be formed from a first metal (e.g., copper, silver, or gold) and bonding components 484, 488, and/or 492 may be formed from a different second metal (e.g., tin, indium, a tin alloy, or an indium alloy).

Electrical connections 480 may provide electrical connections between various elements of stacked IC device assembly 400, for example (a) electrical connections between selected circuitry of first IC device(s) 420 and second IC device(s) 424, (b) electrical connections between selected circuitry of first IC device(s) 420 and selected IC package contact(s) 436 on first interposer 422 (e.g., for electrically connecting selected circuitry of first IC device(s) 420 to selected circuitry of a PCB on which the stacked IC device assembly 400 may be mounted), and/or (c) electrical connections between selected circuitry of second IC device(s) 424 and selected IC package contact(s) 437 on second interposer 426 (e.g., for electrically connecting selected circuitry of second IC device(s) 424 to selected circuitry of a PCB on which the stacked IC device assembly 400 may be mounted).

Figure 5:
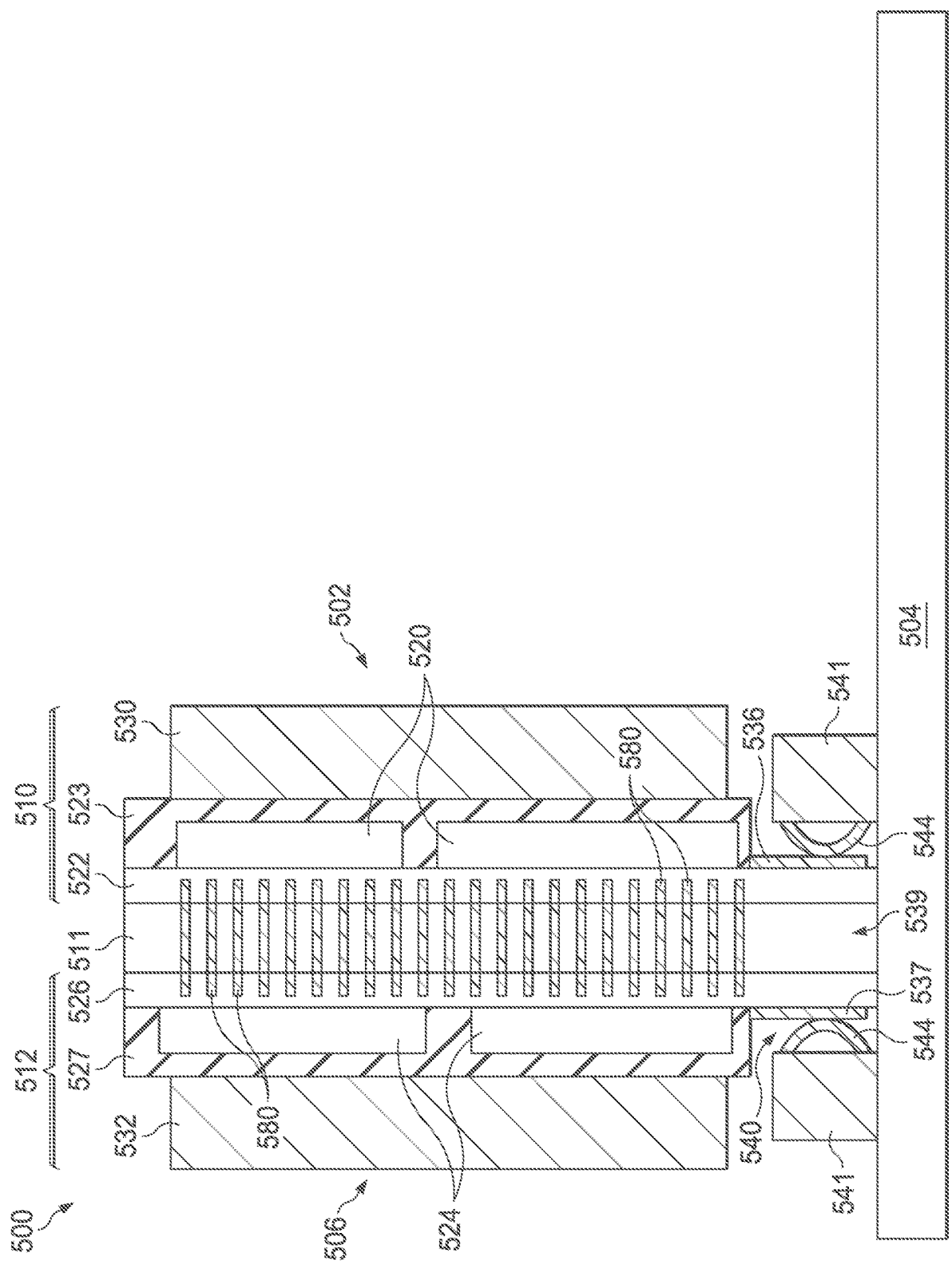
FIG. 5 is a cross-sectional side view of an example IC package mounted to a horizontally-oriented package mounting substrate (e.g., PCB) in a vertical orientation.

FIG. 5 is a cross-sectional side view of an example electronic device 500 including an IC package 502 mounted to a horizontally-oriented package mounting substrate 504 (e.g., a horizontally-oriented PCB) in a vertical orientation. IC package 502 includes a stacked IC device assembly 506 including a first interposer assembly 510 and a second interposer assembly 512 bonded to opposing sides of an intermediate substrate 511, e.g., similar to the example stacked IC device assembly 400 discussed above with respect to FIGS. 4A-4B.

First interposer assembly 510 includes (a) first IC devices 520 mounted to a first interposer 522 and encapsulated by an encapsulation material 523 (e.g., mold compound), (b) first IC package contact 536 on the first interposer 522 proximate a first side 539 of the IC package 502, and optionally (c) a heat transfer device 530 (e.g., heat sink) secured to the encapsulation material 523. Second interposer assembly 512 includes (a) second IC devices 524 mounted to a second interposer 526 and encapsulated by an encapsulation material 527 (e.g., mold compound), and (b) second IC package contact 537 on the second interposer 526 proximate the first side 539 of the IC package 502, and optionally (c) a heat transfer device 532 (e.g., heat sink) secured to the encapsulation material 527.

The stacked IC device assembly 506 includes an array of electrical connections 580 similar to the array of electrical connections 480 discussed above with respect to FIGS. 4A-4B. For example, the array of electrical connections 580 extends through the intermediate substrate 511 and may connect selected circuitry of first IC devices 520 with selected circuitry of second IC devices 524.

As shown, IC package 502 is mounted to the package mounting substrate 504 in a vertical orientation, i.e., wherein the first and second interposers 522 and 527 extend vertically. Generally speaking, package mounting substrate 504 is oriented in a first plane (shown as horizontal, without limitation), and IC package 502 is mounted with an orientation orthogonal to the first plane (shown as vertical, without limitation). In this example, IC package 502 is mounted in a package slot 540 defined by a slot structure 541, e.g., similar to a PCB slot configured for receiving a dual-in-line memory module (DIMM) or a peripheral component interconnect express (PCIe). A number of conductive elements 544, e.g., spring clips, may be arranged in the package slot 540 for electrically connecting selected first IC package contacts 536 and second IC package contacts 537 with selected circuitry provided in and/or mounted on package mounting substrate 504. In some examples, first IC package contacts 536 and second IC package contacts 537 may be releasably engaged with conductive elements 544, such that IC package 502 may be removed and re-inserted (e.g., providing hot-swap capability). In other examples, first IC package contacts 536 and second IC package contacts 537 may permanently affixed to conductive elements 544, e.g., by solder bonding.

Figure 6:
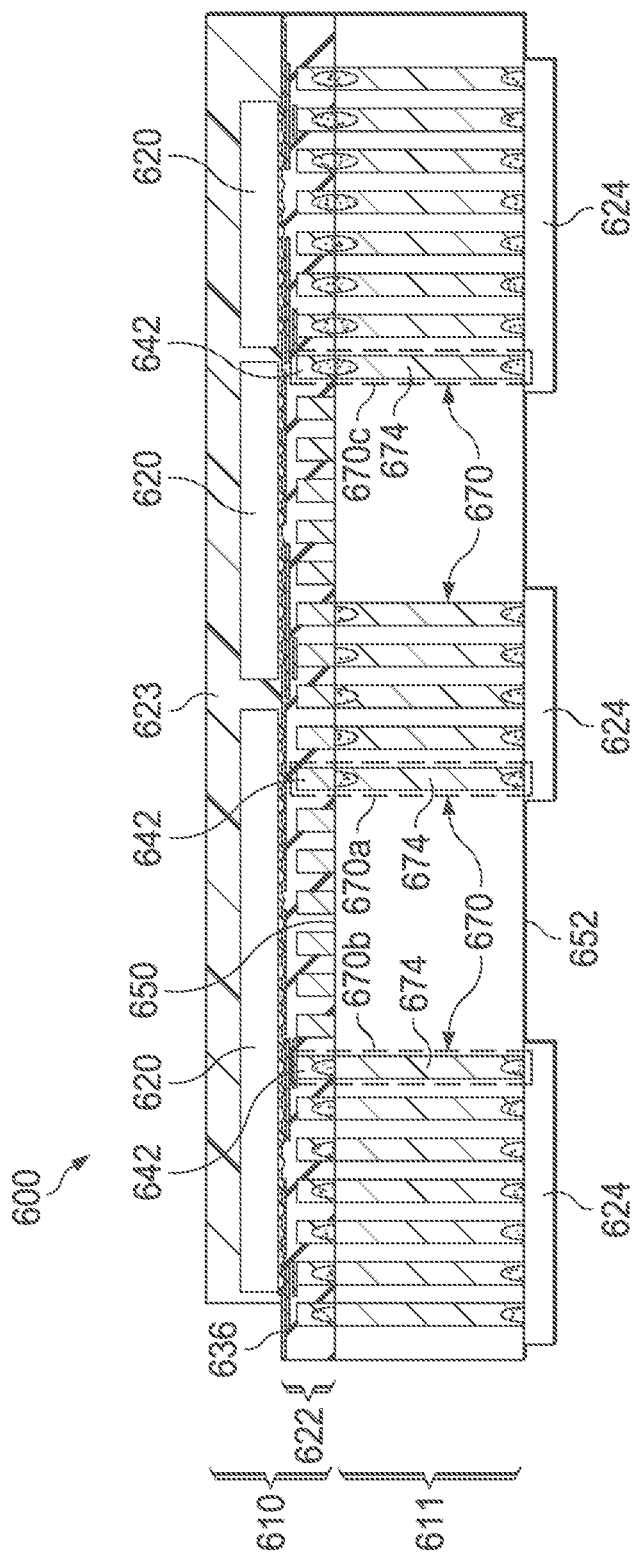
FIG. 6 is a cross-sectional side view of an example stacked IC device assembly including an interposer carrying first IC devices bonded to a first side of an intermediate substrate (e.g., glass substrate) and second IC devices bonded directly to a second side of the intermediate substrate.

FIG. 6 is a cross-sectional side view of an example stacked IC device assembly 600 including (a) an interposer assembly 610 including first IC devices 620 mounted to an interposer 622 bonded to a first side surface 650 of an intermediate substrate 611 (e.g., glass substrate) and (b) second IC devices 624 bonded directly to a second side surface 652 of the intermediate substrate 611. An encapsulation material (e.g., mold compound) is formed over the first IC devices 620.

Intermediate substrate 611 provides includes intermediate connection elements 670 for providing electrical connections between (a) second IC devices 624 and (b) first IC devices 620 and/or IC package contacts 636 provided on interposer 622. Respective interposer connection elements 642 formed in interposer 622 are bonded to a first side of corresponding intermediate connection elements 674, and second IC devices 624 are bonded directly to a second side of selected intermediate connection elements 674, e.g., by solder type bonding.

Each interposer connection element 642 and corresponding intermediate connection element 674 collectively define a connection element pair 670. In each connection element pair 670, one or both of the interposer connection element 642 and corresponding intermediate connection element 674 may be formed as a multi-component bonding element including both a conduction component and a bonding element. FIG. 6 illustrates three example structures for each connection element pair 670. First, example connection element pair 670a includes (a) an intermediate connection element 674 formed as a multi-component bonding element including a conduction component and a bonding element formed at both longitudinal ends of the intermediate connection element 674 and (b) an interposer connection element 642 including at least a conduction component. Second, example connection element pair 670b includes (a) an intermediate connection element 674 formed as a multi-component bonding element including a conduction component and a bonding element formed at one longitudinal end of the intermediate connection element 674 (for bonding a selected second IC device 624) and (b) an interposer connection element 642 formed as a multi-component bonding element including a conduction component and a bonding element. Third, example connection element pair 670c includes (a) an intermediate connection element 674 formed as a multi-component bonding element including a conduction component and a bonding element formed at both longitudinal ends of the intermediate connection element 674 and (b) an interposer connection element 642 formed as a multi-component bonding element including a conduction component and a bonding element.

Figure 7A:
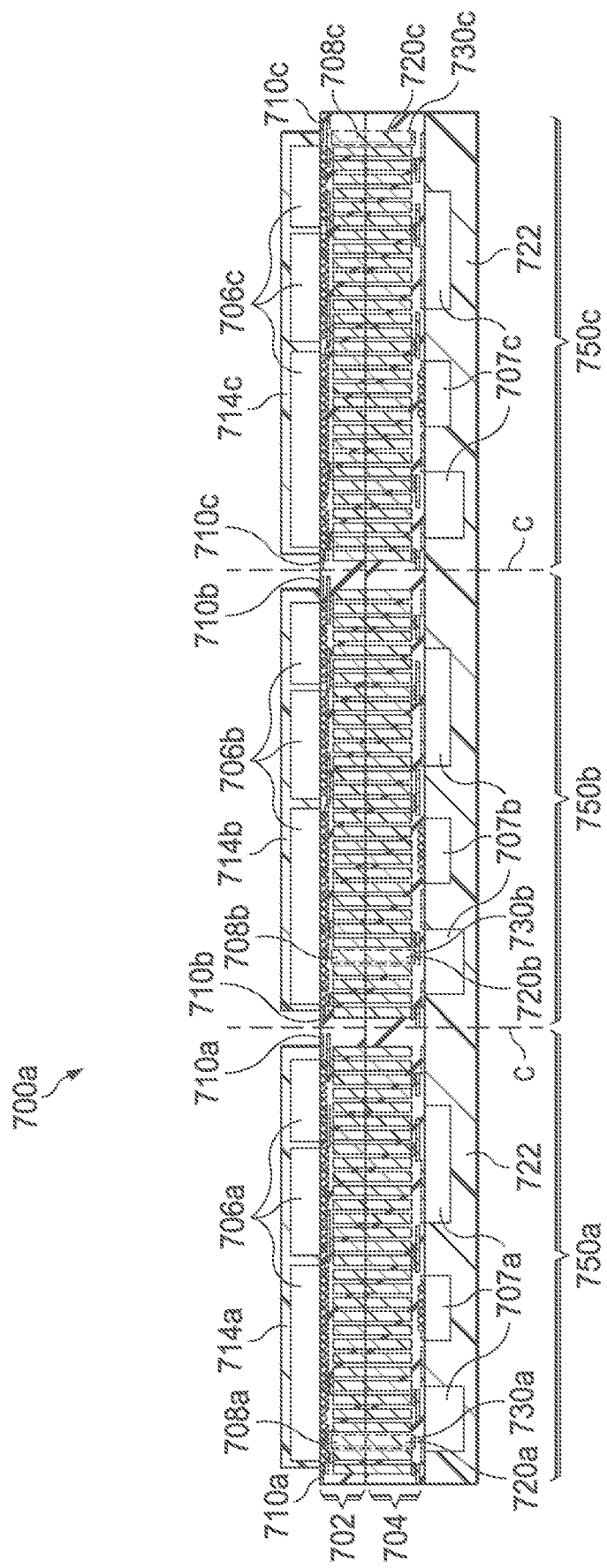

FIGS. 7A, 7B, and 7C are cross-sectional side views of example stacked IC device assemblies, showing three example IC device assemblies with interposer assemblies mounted to each other. First 7A shows a stacked IC device assembly 700a including two undiced (uncut) interposer wafers 702 and 704 bonded together. Three groups of first IC devices 706a, 706b, and 706c are mounted to first interposer wafer 702, and three groups of second IC devices 707a, 707b, and 707c are mounted to second interposer wafer 704.

First interposer wafer 702 includes connection elements 708a, 708b, and 708c, and IC package contacts 710a, 710b, and 710c. As explained below, connection elements 708a and IC package contacts 710a correspond with first IC devices 706a; connection elements 708b and IC package contacts 710b correspond with first IC devices 706b; and connection elements 708c and IC package contacts 710c correspond with first IC devices 706c. A die encapsulation 714a, 714b, and 714c may be formed over each respective group of first IC devices 706a, 706b, and 706c but leaving the IC package contacts 710a, 710b, 710c exposed.

Second interposer wafer 704 includes connection elements 720a, 720b, and 720c electrically connected to selected second IC devices 707a, 707b, and 707c, respectively. A unitary die encapsulation 722 may be formed over second IC devices 707a, 707b, and 707c.

Connection elements 708a, 708b, and 708c are bonded to corresponding connection elements 720a, 720b, and 720c to define connection element pairs 730a, 730b, and 730c, respectively. Connection element pairs 730a provide electrical connections between (a) selected circuitry of second IC devices 707a and (b) selected circuitry of first IC devices 706a and/or selected IC package contacts 710a. Connection element pairs 730b provide electrical connections between (a) selected circuitry of second IC devices 707b and (b) selected circuitry of first IC devices 706b and/or selected IC package contacts 710b. Connection element pairs 730c provide electrical connections between (a) selected circuitry of second IC devices 707c and (b) selected circuitry of first IC devices 706c and/or selected IC package contacts 710c.

After being constructed as shown in FIG. 7A, the interposer assembly 700a may be diced along cut lines C to define three discrete stacked IC device assemblies 750a, 750b, and 750c, each of which may then be mounted to a respective chip carrier (e.g., leadframe or copper clip) which may be mounted to a package mounting substrate (e.g., PCB).

First 7B shows a stacked IC device assembly 700b including three diced first interposer wafers 702a, 702b, and 702c bonded to an undiced (uncut) second interposer wafer 704. Diced first interposer wafers 702a, 702b, and 702c may be diced prior to bonding to undiced second interposer wafer 704.

Each diced first interposer wafer 702a, 702b, 702c, carries a respective group of first IC devices 706a, 706b, and 706c. First interposer wafer 702a includes connection elements 708a and IC package contacts 710a. First interposer wafer 702b includes connection elements 708b and IC package contacts 710b. First interposer wafer 702c includes connection elements 708c and IC package contacts 710c. A die encapsulation 714a, 714b, and 714c may be formed over each respective group of first IC devices 706a, 706b, and 720c but leaving the IC package contacts 710a, 710b, 710c exposed.

Second interposer wafer 704 carries three groups of second IC devices 707a, 707b, and 707c. Interposer wafer 704 includes connection elements 720a, 720b, and 720c electrically connected to selected second IC devices 707a, 707b, and 707c, respectively. A unitary die encapsulation 722 may be formed over second IC devices 707a, 707b, and 707c.

Connection elements 708a, 708b, and 708c are bonded to corresponding connection elements 720a, 720b, and 720c to define connection element pairs 730a, 730b, and 730c, respectively. Connection element pairs 730a provide electrical connections between (a) selected circuitry of second IC devices 707a and (b) selected circuitry of first IC devices 706a and/or selected IC package contacts 710a. Connection element pairs 730b provide electrical connections between (a) selected circuitry of second IC devices 707b and (b) selected circuitry of first IC devices 706b and/or selected IC package contacts 710b. Connection element pairs 730c provide electrical connections between (a) selected circuitry of second IC devices 707c and (b) selected circuitry of first IC devices 706c and/or selected IC package contacts 710c.

After being constructed as shown in FIG. 7B, the stacked IC device assembly 700b may be diced along cut lines C to define three discrete stacked IC device assemblies 750a, 750b, and 750c, each of which may then be mounted to a respective chip carrier (e.g., leadframe or copper clip) which may be mounted to a package mounting substrate (e.g., PCB).

First 7C shows a stacked IC device assembly 700c including a first diced interposer 702 (carrying first IC devices 706) bonded to a second diced interposer 704 (carrying second IC devices 707), wherein the interposer wafers are diced to form interposers 702, 704, prior to being bonded to each other. Connection elements 708 formed in interposer 702 are bonded to corresponding connection elements 720 formed in interposer wafer 704 to define an array of connection element pairs 730. Connection element pairs 730 provide electrical connections between (a) selected circuitry of second IC devices 707 and (b) selected circuitry of first IC devices 706 and/or selected IC package contacts 710 provided on interposer wafer 702.

In any of the example assemblies 700a, 700b, and 700c shown in FIGS. 7A, 7B, and 7C, any of the connection elements 708 and/or 720 may be formed as a multi-component bonding element including a conduction component and a bonding element, e.g., as described herein.

The invention claimed is:

1. An electronic device, comprising:
   a first interposer including:
      first interposer circuitry; and
      a first connection element electrically connected to the first interposer circuitry:
   a first integrated circuit (IC) device affixed to the first interposer;
   a second interposer bonded to the first interposer and including:
      second interposer circuitry; and
      a second connection element electrically connected to the second interposer circuitry;
   a second IC device affixed to the second interposer;
   wherein the second connection element is bonded to the first connection element to define a connection element pair;
   wherein the connection element pair provides an electrical connection between the first interposer circuitry and the second interposer; and
   wherein the first connection element is a multi-component bonding element including (a) a conduction component formed from a first metal and (b) a bonding component formed from a second metal different than the first metal, wherein both the conduction component and the bonding component of the first connection element are in direct contact with the second connection element.

2. The electronic device of claim 1, wherein:
   the first IC device includes first IC device circuitry;
   the second IC device includes second IC device circuitry; and
   the first IC device circuitry is electrically connected to the second IC device circuitry via the first interposer circuitry, the connection element pair, and the second interposer circuitry.

3. The electronic device of claim 1, wherein the first interposer, the second interposer, the first IC device, and the second IC device are part of an IC package;
   wherein the IC package is mounted to a package mounting substrate.

4. The electronic device of claim 3, wherein the package mounting substrate comprises a printed circuit board (PCB).

5. The electronic device of claim 3, wherein:
   the IC package includes a chip carrier;
   the first interposer, the second interposer, the first IC device and the second IC device are part of a stacked IC device assembly, the stacked IC device assembly part of the IC package;
   the stacked IC device assembly is affixed to the chip carrier; and
   the chip carrier is mounted to the package mounting substrate.

6. The electronic device of claim 5, wherein the chip carrier comprises a copper clip or a lead frame.

7. The electronic device of claim 5, wherein:
   the first interposer circuitry includes an IC package contact;
   the second interposer circuitry is electrically connected to the IC package contact via the connection element pair; and
   the IC package includes a first wire bond connection between the IC package contact and the chip carrier.

8. The electronic device of claim 1, wherein:
   the first metal has a first melting point; and
   the second metal has a second melting point, the second melting point lower than the first melting point.

9. The electronic device of claim 1, wherein:
   the first metal comprises copper, silver, or gold; and
   the second metal comprises tin, indium, a tin alloy, or an indium alloy.

10. The electronic device of claim 1, wherein:
    the second connection element comprises a second multi-component bonding element including:
       a second conduction component formed from a third metal; and
       a second first bonding component formed from a fourth metal different than the third metal.

11. The electronic device of claim 10, wherein:
    the first metal and the third metal comprise the same metal; and
    the second metal and the fourth metal comprise the same metal.

12. An electronic device, comprising:
    an integrated circuit (IC) package, including:
       a first interposer including:
          first interposer circuitry; and
          a first connection element electrically connected to the first interposer circuitry:
       a first IC device affixed to the first interposer;
       a second interposer bonded to the first interposer and including:
          second interposer circuitry; and
          a second connection element electrically connected to the second interposer circuitry;
       a second IC device affixed to the second interposer;
       wherein the second connection element is bonded to the first connection element to define a connection element pair;
       wherein the connection element pair provides an electrical connection between the first interposer circuitry and the second interposer; and
    a printed circuit board (PCB) oriented in a first plane, the PCB including:
       a PCB slot; and
       PCB circuitry electrically connected to the PCB slot;
    wherein the IC package is mounted in the PCB slot in an orientation orthogonal to the first plane.

13. The electronic device of claim 12, wherein:
the first interposer includes a first contact electrically connected to a first IC device circuitry of the first IC device;
the second interposer includes a second contact electrically connected to a second IC device circuitry of the second IC device;
the PCB slot includes a first PCB slot contact and a second PCB slot contact;
the first contact of the first interposer is electrically connected to the first PCB slot contact; and
the second contact of the second interposer is electrically connected to the second PCB slot contact.

14. The electronic device of claim 13, wherein:
the first contact of the first interposer comprises a first wire-bond pad or a first pin-out contact on the first interposer; and
the second contact of the second interposer comprises a second wire-bond pad or a second pin-out contact on the second interposer.

15. An electronic device, comprising:
an integrated circuit (IC) package including:
a chip carrier;
a first interposer assembly including:
a first interposer;
a first IC device affixed to the first interposer; and
a second IC interposer assembly including:
a second interposer; and
a second IC device affixed to the second interposer;
wherein the first interposer is bonded to the second interposer with the first interposer and the second interposer arranged between the first IC device and the second IC device; and
wherein the IC package is mounted on a mounting portion of the chip carrier; and
a package mounting substrate;
wherein the chip carrier is affixed to the package mounting substrate to mount the IC package on the package mounting substrate; and
wherein the mounting portion of the chip carrier is physically spaced apart from the package mounting substrate, so that the IC package is physically spaced apart from the package mounting substrate to decouple a coefficient of thermal expansion (CTE) mismatch between the IC package and the package mounting substrate.

16. The electronic device of claim 15, wherein the package mounting substrate comprises a printed circuit board.

17. The electronic device of claim 15, wherein the chip carrier comprises a copper clip or a lead frame.

18. The electronic device of claim 15, wherein:
the first interposer includes including an IC package contact; and
the IC package includes a wire bond connection between the IC package contact and the chip carrier.

19. The electronic device of claim 15, wherein:
the first interposer includes a first connection element;
the second interposer includes a second connection element bonded to the first connection element; and
at least one of the first connection element and the second connection element comprises a multi-component bonding element including:
a conduction component formed from a first metal; and
a bonding component formed from a second metal different than the first metal.

20. An electronic device, comprising:
a first interposer including:
first interposer circuitry; and
a first connection element electrically connected to the first interposer circuitry:
a first integrated circuit (IC) device affixed to the first interposer;
a second interposer including:
second interposer circuitry; and
a second connection element electrically connected to the second interposer circuitry;
a second IC device affixed to the second interposer;
an intermediate substrate arranged between the first interposer and the second interposer, the intermediate substrate including an intermediate connection element extending through a thickness of the intermediate substrate;
wherein the first connection element of the first interposer is bonded to a first side of the intermediate connection element;
wherein the second connection element of the second interposer is bonded to a second side of the intermediate connection element; and
wherein the first connection element, the intermediate connection element, and the second connection element provide an electrical connection between the first interposer circuitry and the second interposer circuitry.

21. The electronic device of claim 20, wherein the intermediate substrate comprises a glass substrate.

22. The electronic device of claim 20, wherein the intermediate connection element comprises a multi-component bonding element including:
a conduction component formed from a first metal; and
a bonding component formed from a second metal different than the first metal.

23. The electronic device of claim 20, wherein:
the first connection element comprises a first multi-component bonding element including:
a first conduction component formed from a first metal; and
a first bonding component formed from a second metal different than the first metal, wherein the first bonding component is bonded to the first side of the intermediate connection element;
the second connection element comprises a second multi-component bonding element including:
a second conduction component formed from a third metal; and
a second bonding component formed from a fourth metal different than the third metal, wherein the second bonding component is bonded to the second side of the intermediate connection element.

24. The electronic device of claim 23, wherein:
the first metal and the third metal comprise the same metal; and
the second metal and the fourth metal comprise the same metal.

* * * * *